United States Patent
Lee et al.

(10) Patent No.: US 7,214,304 B2
(45) Date of Patent: May 8, 2007

(54) PROCESS FOR PREPARING A NON-CONDUCTIVE SUBSTRATE FOR ELECTROPLATING

(76) Inventors: Hyunjung Lee, 274 Spring St. Apt. #8, Naugatuck, CT (US) 06770; Richard C. Retallick, 22 Stoner Dr., West Hartford, CT (US) 06107

( * ) Notice: Subject to any disclaimer, the term of this patent is extended or adjusted under 35 U.S.C. 154(b) by 66 days.

(21) Appl. No.: 10/964,212

(22) Filed: Oct. 13, 2004

(65) Prior Publication Data

US 2006/0076245 A1     Apr. 13, 2006

(51) Int. Cl.
*C25D 5/02*    (2006.01)
*C25D 5/34*    (2006.01)
*C25D 5/48*    (2006.01)
*H05K 3/00*    (2006.01)

(52) U.S. Cl. .................... 205/118; 205/125; 205/210; 205/223

(58) Field of Classification Search ........... 205/125, 205/163, 166, 210, 118, 223
See application file for complete search history.

(56) References Cited

U.S. PATENT DOCUMENTS

| | | | | |
|---|---|---|---|---|
| 4,724,005 A | | 2/1988 | Minten et al. | 106/307 |
| 4,964,959 A | | 10/1990 | Nelsen et al. | 204/15 |
| 5,139,642 A | | 8/1992 | Randolph et al. | 205/125 |
| 5,674,372 A | * | 10/1997 | Kukanskis et al. | 205/118 |
| 6,146,701 A | * | 11/2000 | Ferrier | 427/327 |
| 6,565,731 B1 | * | 5/2003 | Couble et al. | 205/125 |

* cited by examiner

*Primary Examiner*—Edna Wong
(74) *Attorney, Agent, or Firm*—Carmody & Torrance LLP

(57) ABSTRACT

A process for preparing a non-conductive substrate for electroplating is proposed. The proposed process comprises contacting the substrate, after desmear, with a combined neutralization/sacrificial coating solution followed by treatment with a carbon dispersion solution. The combined neutralization/sacrificial coating solution neutralizes permanganate residues from the desmear step and applies a sacrificial coating to metallic surfaces on the substrate. The sacrificial coating allows for easy and reliable removal of unwanted carbon residues from the metallic surfaces prior to electroplating.

6 Claims, No Drawings

PROCESS FOR PREPARING A NON-CONDUCTIVE SUBSTRATE FOR ELECTROPLATING

BACKGROUND OF THE INVENTION

The present invention relates to a process for enhancing the electroplating of non-conductive surfaces, such as the through holes of a printed circuit board (PCB). In particular, the invention comprises an improved process for plating non-conductive surfaces without the need for electroless plating. The improved process is particularly suitable for plating surfaces, such as printed circuit boards, which comprise both non-conductive and conductive (metallic) surfaces.

Printed circuit boards are generally composed of a non-conductive layer, such as an epoxy resin/glass fiber mixture, which is positioned between copper or nickel plates or foils, or other conductive metal layers. There can also be a multiplicity of these alternating layers. Commonly, holes are drilled through the PCB to establish a connection between the conductive metal layers at specific points in the board. The holes are then metallized to form a connection between the conductive materials, usually by plating.

In order to achieve conductivity and a consistent, reliable bond between the electroplated metal (usually copper), and the through holes, the through holes are usually first provided with a layer of electroless copper in a process which requires several steps, including, desmear, pre-activation, activation with a palladium/tin activator, application of an accelerator, electroless copper deposition and one or more rinses, before electroplating could be effected. The need for application of electroless copper can be avoided, it has been found, by the deposition of carbon on the through holes or other non-conductive surfaces which are to be electroplated. In this way, the long process time, complex chemistry requiring constant monitoring, and sensitivity of electroless baths can be avoided. Moreover, the expensive waste treatment often required with electroless copper and palladium/tin activators can be eliminated.

However, the use of a carbon deposition process may have several drawbacks. After carbon deposition, it takes several minutes before the non-conductive surface being plated is completely covered by the electroplated metal. This is especially significant where the surface to be plated is a through hole. Electroplating after treatment with carbon begins adjacent to the outer conductive surfaces (i.e., the copper foil) of the PCB and extends inward towards the center of the hole. This occurs from both sides of the through hole and the plating meets in the center and completes the connection.

The first practical teaching of a carbon black deposition system, which permits the elimination of electroless copper deposition prior to electroplating, was by Minten and Pismennaya in U.S. Pat. No. 4,724,005, the disclosure of which is incorporated herein by reference in its entirety. A long line of patents have issued concerning improvements to or variations in the process described in U.S. Pat. No. 4,724,005 including U.S. Pat. No. 5,139,642 to Randolph et al., the teachings of which are incorporated herein by reference in their entirety.

Current carbon based plating processes require a microetch step after the carbon application in order to remove the carbon from the copper surfaces of printed circuit boards (eg. circuitry and inner layer connections) so as to insure good copper to copper adhesion with the subsequent plating. Typically substantial microetching is needed to reliably remove the carbon. Usually 40–60 micro inches of copper is removed in the micro etch. However, microetching frequently causes problems, particularly in plating in the area of the copper-dielectric interface. In particular, etching the copper frequently also strips the carbon coating from the dielectric area directly adjacent to the copper, thereby creating an insulating barrier for electrical continuity in the subsequent electroplating. This barrier then leads to poor plating and defects such as voids, knit lines, and plating folds. The prior art requirement for microetching prior to electroplating in carbon-based processes is detailed in U.S. Pat. No. 4,964,959 (Column 10, lines 5–60), the entire teachings of which are incorporated herein by reference. U.S. Pat. No. 4,964,959 describes the use of a microetch to "flake off" the carbon on the copper surfaces.

This invention proposes a modification to one of the standard process steps in the copper plating cycle, namely the neutralization step in the desmear cycle. The modified neutralization step proposed accomplishes both the required neutralization function as well as the application of a thin sacrificial coating to the copper surfaces prior to the application of carbon. The sacrificial coating allows the subsequent removal of carbon from the copper surfaces to be achieved more reliably with less microetching. Thus, an improvement is provided without unwanted expansion of the process cycle.

SUMMARY OF THE INVENTION

This invention proposes a process for plating surfaces comprised of metallic areas and non-conductive areas, said process comprising contacting the surfaces to be plated with the following solutions:

a. alkaline desmear solution comprising permanganate ions;
b. neutralization solution comprising (i) acid, (ii) hydrogen peroxide, and (iii) corrosion inhibitor;
c. conditioner solution comprising surfactant or water soluble polymer;
d. carbon dispersion comprising (i) surfactant or water soluble polymer; (ii) carbon black and/or graphite particles;
e. dry;
f. microetch solution comprising (i) acid, and (ii) and oxidizer; and
g. copper electroplating solution.

Water rinses are interspersed after steps a, b, c, f and g.

DETAILED DESCRIPTION OF THE INVENTION

As noted above, a preferred embodiment of the present invention relates to the preparation of a PCB through hole for the deposition of an electroplated layer of copper or other conductive metal (such as nickel, gold, silver, etc.) so as to form a connection between conductive metal layers which are sandwiched with non-conductive layers. Although this description will be written in terms of electroplating (or metalizing) the through holes of printed circuit boards, it will be understood that such is for ease of description only, and that the disclosed process is equally applicable to the preparation of various non-conductive surfaces for deposition of an electroplated metal layer on plastics applications.

Printed circuit boards are generally comprised of two or more plates or foils of nickel or copper, which are separated from each other by a layer of non-conducting material. The non-conducting layers are typically comprised of an organic material such as an epoxy resin which has been reinforced with glass fiber. Alternatively, the non-conducting layer may also be comprised of thermosetting resins, thermoplastic resins, and mixtures thereof, with or without reinforcing materials such as fiberglass and fillers.

Suitable thermoplastic resins include the acetyl resins; acrylics, such as methyl acrylate; cellulosic resins, such as ethyl cellulose, cellulose acetate, cellulose propionate, cellulose acetate butyrate, cellulose nitrate, and the like; chlorinated polyethers; nylon, polyethylene; polypropylene, polystyrene, styrene blends, such as acrylonitrile styrene co-polymers; polycarbonates; polychlorotrifluorethylene; and vinyl polymers and co-polymers, such as vinyl acetate, vinyl alcohol, vinyl butyral, vinyl chloride, vinyl chloride-acetate co-polymer, vinylidene chloride and vinyl formal.

Suitable thermosetting resins include alkyl phthalate; furane; melamine-formaldehyde; phenol formaldehyde and phenol-furfural co-polymer, alone or compounded with butadiene acrylonitrile co-polymers; polyacrylic esters; silicones; urea formaldehydes; epoxy resins, polyimides, alkyl resins, glycerol phthalates; polyesters; and the like.

Through holes are formed in printed circuit boards in order to establish connection between the metal plates at certain points in the board to produce the desired electrical pattern. This is usually accomplished by drilling holes at the desired locations through the copper plates and the non-conducting layers, and then connecting the separate metal plates by metallizing the through holes (i.e., coating the inner surface of the through hole with a conductive metal). The hole diameters of PCBs generally range from about 0.15 millimeters to about 10.0 millimeters, more typically from about 0.3 millimeters to about 1.0 millimeters.

In order to make the walls of the through holes relatively smooth, if desired, it may be necessary to deburr the holes. In the case of multilayer printed circuit boards, it is also be desirable to subject the boards to a desmear operation to clean the inner copper interfacing surfaces of the through holes.

A typical desmear solution comprises an alkaline solution of permanganate ions, usually provided by sodium or potassium permanganate at concentrations of from about 25 g/l to about 170 g/l. If desired, before the desmear solution is used, a solvent or swellant can be used to soften or swell the resin of the non-conductive surfaces and thereby enhance the ability of the desmear solution to etch those surfaces. Typically the desmear solution is used at elevated temperatures of from about 100° F. to about 180° F., and contact times ranging from 2 minutes to 30 minutes.

After going through the desmear process, the surfaces are rinsed in water and then contacted with the combined neutralizer/sacrificial coating solution proposed by this invention. The neutralizer/sacrificial coating solution comprises an aqueous solution of (i) hydrogen peroxide, (ii) acid and (iii) corrosion inhibitor. The concentration of hydrogen peroxide may range from about 2 g/l to about 60 g/l but is preferably from about 3 g/l to about 30 g/l. The acid can be any acid which is stable in combination with the hydrogen peroxide but is preferably a mineral acid and is most preferably sulfuric acid. If sulfuric acid is used, concentration will preferably range from about 30 to about 200 g/l. The corrosion inhibitor(s) are preferably selected from the group consisting of alkyl imidazoles, alkyl triazoles, aromatic imidazoles, aromatic triazoles and mixtures of the foregoing compounds. Most preferably the corrosion inhibitor(s) are selected from the group consisting of benzotriazole, hydroxy benzotriazole and mixtures of the foregoing compounds. The concentration of corrosion inhibitor(s) should preferably range from about 0.5g/l to about 20 g/l. In addition to the foregoing three ingredients the neutralizer/sacrificial coating solution may also comprise surfactants, water soluble polymers, halide ions and other additives known in the art. In this regard, reference is made to U.S. Pat. No. 6,146,701, the teachings of which are incorporated herein by reference in their entirety.

The part to be plated is neutralized and the sacrificial coating is applied by contacting the part with the neutralizer/sacrificial coating solution via immersion, spray or flood. The contact time may vary from 0.5 to 10 minutes and the operating temperature may range from 70 to 150° F. The part is then rinsed in water and proceeds through the typical carbon based plating cycle.

Advantageously, the printed circuit board is precleaned in order to place it in condition for receiving the liquid carbon black dispersion of this invention. In one preferred precleaning operation, the PCB is placed in a cleaner/conditioner bath for several minutes at a temperature of about 130 degree F. to remove grease and other impurities from the hole wall surfaces. One preferred Cleaner/Conditioner, Blackhole Conditioner, is sold by MacDermid Incorporated of Waterbury, Conn. After the application of the cleaner/conditioner, the printed circuit board is rinsed to remove any residual cleaner/conditioner from the board. Advantageously, the cleaner/conditioner should be alkaline so as not to remove the sacrificial layer. It should be recognized that none of the above-mentioned hole drilling or pre-cleaning operations is a critical feature of the present invention. Any and all conventional equivalents to these operations may be used instead.

Typically, the carbon deposition process involves the application of a liquid carbon dispersion to the cleaned printed circuit board. This dispersion contains three principal ingredients, namely carbon, one or more surfactants capable of dispersing the carbon, and a liquid dispersing medium such as water. The preferred methods of applying the dispersion to the PCB include immersion, spraying or other methods of applying chemicals used in the printed circuit board industry. A single working bath is sufficient for applying this carbon black dispersion; however, more than one bath may be used for rework or other purposes.

In preparing the liquid carbon dispersion, the three primary ingredients, and any other preferred ingredients, are mixed together to form a stable dispersion. This may be accomplished by subjecting a concentrated form of the dispersion to ball milling, colloidal milling, high-shear milling, ultrasonic techniques or other like procedures to thoroughly mix the ingredients. The dispersion can then be later diluted with more water to the desired concentration for the working bath. The preferred method of mixing is ball milling a concentrated form of the dispersion in a container having glass mineral or plastic beads therein for at least about 1 hour. The mixing can continue for up to about 24 hours. This thorough mixing allows for the carbon particles to be intimately coated or wetted with the surfactant. The mixed concentrate is then mixed with water or some other liquid dispersing medium to the desired concentration. The working bath is preferably kept agitated during both the diluting and applying steps to aid in maintaining dispersion stability.

The particle diameter of the carbon particles should average no more than about 3 microns while in the dispersion. It is desirable to have this average particle diameter of carbon as small as possible to obtain desired plating characteristics, such as substantially even plating and no plating pullaways. The average particle diameter of the carbon particles is preferably from about 0.05 microns to about 3.0 microns, more preferably between about 0.08 microns and about 1.0 microns when in the dispersion. The term "average particle diameter" as used herein refers to the average mean diameter of the particles (the average by number). The average mean diameter in the dispersion may be determined through the use of either a NiComp Model 370 submicron particle sizer (Version 3.0) or a HIAC PA-720 automatic particle size analyzer (both available from the HIAC/ROYCO Instrument Division of Pacific Scientific of Menlo Park, Calif.). It is also important to maintain the size distribution of the carbon particles to a relatively narrow distribution.

Many types of carbon may be used for this invention including the commonly available carbon blacks, furnace blacks, and suitable small particle graphites. However, it is preferred to utilize carbon blacks which are initially acidic or neutral, i.e. those which have a pH of between about 1 and about 7.5 and more preferably between about 2 and about 4 when slurried with water. The carbon black particles which are preferred are also very porous and generally have as their surface area from about 45 to about 1100, and preferably about 300 to about 600, square meters per gram, as measured by the BET method (method of Brunauer-Emmert-Teller).

Among the commercially available carbon blacks suitable for use in this invention are Cabot XC-72R Conductive, Cabot Monarch 800, Cabot Monarch 1300, all available from Cabot Corporation of Boston, Mass. Other suitable carbon blacks include Columbian T-10189, Columbian Conductiex 975 Conductive, Columbian CC-40,220, and Columbian Raven 3500, all available from Columbian Carbon Company of New York, N.Y. Cabot Monarch 1300 and Columbian Raven 3500 are the two most preferred carbon blacks because of their ease of dispersion and low pH. Suitable graphites include Showa-Denko UFG available from Showa-Denko K.K., 13-9 Shiba Daimon 1-Chrome, Minato-Ku, Tokyo, 105 Japan, Nippon Graphite AUP available from Nippon Graphite Industries, Ishiyama, Japan, and Asbury Micro 850, available from Asbury Graphite Mills of Asbury, N.J.

In addition to water and carbon a surfactant capable of dispersing the carbon in the liquid dispersing medium is employed in the dispersion. One or more surfactants is added to the dispersion to enhance the wetting ability and stability of the carbon and to permit maximum penetration by the carbon within the pores and fibers of the non-conducting layer of the PCB. Suitable surfactants include anionic, nonionic and cationic surfactants (or combinations thereof such as amphoteric surfactants). The surfactant should be soluble, stable and preferably non-foaming in the liquid carbon dispersion. In general, for a polar continuous phase as in water, the surfactant should preferably have a high HLB number (8–18).

The preferred type of surfactant will depend mainly on the pH of the dispersion. Preferably the total dispersion is alkaline (i.e. has an overall pH in the basic range) so as not to disturb the sacrificial layer. In this case, it is preferred to employ an anionic or nonionic surfactant. Acceptable anionic surfactants include sodium or potassium salts of naphthalene sulfonic acid such as DARVAN No. 1, commercially available from Eastern Color and Chemical, PETRO AA and PETRO ULE, commercially available from Petro Chemical Co., Inc., and AEROSOL OT, commercially available from American Cyanarmid. Preferred anionic surfactants include neutralized phosphate ester-type surfactants such as MAPHOS 55,56,8135, 60A and L6, commercially available from BASF Chemical Co. The most preferable anionic surfactant for a liquid carbon black dispersion is MAPHOS 56. Suitable nonionic surfactants include ethoxylated nonyl phenols such as the POLY-TERGENT B-series from Olin Corporation or alkoxylated linear alcohol's such as the POLY-TERGENT SL-series, also from Olin Corporation.

Advantageously, carbon is present in the dispersion in an amount of less than about 15% by weight of the dispersion, preferably less than about 5% by weight, most preferably less than 2% by weight, particularly when the form of carbon is carbon black. It has been found that the use of higher concentrations of carbon blacks may provide undesirable plating characteristics. In the same regard, the solids content (i.e. all of the ingredients other than the liquid dispersing medium) is preferably less than about 10% by weight of the dispersion, more preferably, less than about 6% by weight.

The liquid dispersion of carbon is typically placed in a vessel and the printed circuit board is immersed in, sprayed with or otherwise contacted with the liquid dispersion. The temperature of the liquid dispersion in an immersion bath should be maintained at between about 15 degree C. and about 35 degree C. and preferably between about 20 degree C. and about 30 degree C. during immersion. The period of immersion advantageously ranges from about 15 seconds to about 10 minutes, more preferably from about 30 seconds to 5 minutes.

The immersed board is then removed from the bath of the liquid carbon-containing dispersion and is preferably contacted with compressed air to unplug any through holes that may still retain plugs of the dispersion. In addition, excess basic liquid carbon-containing dispersion is removed from the face of the copper plates.

Next, substantially all (i.e. over about 90% by weight) of the water (or other liquid dispersing medium) in the applied dispersion is removed and a dried deposit containing carbon is left on the surfaces of the non-conducting material. This may be accomplished by several methods such as by evaporation at room temperature, by a vacuum, or by heating the board for a short time at an elevated temperature. Heating at an elevated temperature is the preferred method. Heating is generally carried out for between about 5 and about 45 minutes at a temperature of from about 75 degree C. to about 120 degree C., more preferably from about 80 degree to 98 degree C. To insure complete coverage of the hole walls, the procedure of immersing the board in the liquid carbon dispersion and then drying may be repeated one or more times.

The resulting PCB is often completely coated with the carbon dispersion. The dispersion is not only coated on the drilled hole surfaces, as desired, but also coats the copper plate or foil surfaces, which is disadvantageous. Thus prior to any further processing, the carbon should be removed from the copper plate or foil surface.

After the carbon dispersion has been dried on the part, the part is dipped in a mild acid microetch solution in order to remove the unwanted carbon from the metallic (copper) surfaces. A variety of acids including hydrochloric acid, sulfuric acid, acetic acid, citric acid, tartaric acid and the like may be used. The concentration of the acid may range from 0.5% to 50% by weight, preferably from 1% to 10% by weight, with water and the chosen oxidizer essentially making up the remainder. Generally the oxidizer is either hydrogen peroxide or a persulfate. Application of the acid microetch solution can be by any conventional means such as by immersion or spray. After removal of the unwanted carbon from the metallic surfaces, the parts are ready for the standard electroplating process as subsequently indicated.

Optionally, a standard soak cleaner, as is typically used in electroplating processes, may be employed at this point prior to electroplating.

The thusly treated printed wiring board is then immersed in a suitable electroplating bath for applying a copper coating on the hole walls of the non-conducting layer. The present invention contemplates the use of any and all electroplating operations conventionally employed in applying a metal layer to the through hole walls of a PCB. Therefore this claimed invention is not limited to any particular electroplating bath parameters.

A typical copper electroplating bath is comprised of copper, copper sulfate, sulfuric acid and chloride ion in aqueous solution. The electroplating bath is normally agitated and preferably maintained at a temperature of between about 20 degree C. and about 25 degree C. The electroplating bath is provided with anodes, generally constructed of copper, and the printed circuit board to the plated is connected as a cathode to the electroplating circuit. A current is then impressed across the electroplating circuit for a period of between about 60 and about 90 minutes in order to effect copper plating on the hole walls of the non-conducting layer positioned between the two plates of copper. This copper plating of the hole wall provides a current path between the copper layers of the printed circuit board. Other suitable electroplating conditions may be employed, if desired. Other electroplating bath compositions containing other copper salts or other metal salts such as salts of nickel, gold, silver and the like may be employed, if desired.

The printed circuit board is removed from the copper electroplating bath and then washed and dried to provide a board which is further processed by applying photoresist compounds and the like, as is known in the art for the preparation of printed circuit boards. The invention is further illustrated with reference to the following examples which should not be taken as limiting.

EXAMPLE 1

Double-sided boards (copper foil is laminated to opposite sides of an epoxy resin/fiberglass composite) were mechanically scrubbed and processed through the following sequence for the indicated time. All procedures were performed by immersion in a beaker without any special impingement.
1) M-treat BIO Hole Conditioner® (4 minutes)*
2) Rinse with water (2 minutes)
3) M-Permanganate P® (8 minutes)*
4) Rinse with water (3 minutes)
5) Neutralization with indicated solution (1 minute)
6) Rinse with water (1 minute)
7) Air dry
8) Blackhole® Conditioner ESP (30 seconds)*
9) Rinse with water (30 seconds)
10) Blackhole Carbon black dispersion ( 45 seconds )*
11) Air dry/heat treatment at 40° C. (2 min)
12) Microetch with Blackhole® Microclean (for the indicated amount of copper removal)
13) Rinse with water (30 seconds)
14) Air dry

* Available from MacDermid, Incorporated, 245 Freight Street, Waterbury, Conn. 06702.

After treatment with this sequence of baths, surfaces of copper panels were visually inspected. The cleanliness of panels was described in Table 1.

TABLE 1

Cleanliness of copper surface with or without sacrificial coating

| Run | Neutralization | Amount of copper etch with Microclean (micro inch) | Cleanliness of copper surface |
|---|---|---|---|
| 1 | Hydroxylaminesulfate | 40 | Clean |
| 2 | Hydroxylaminesulfate | 20 | carbon residue remained |
| 3 | Hydroxylaminesulfate | 10 | carbon residue remained |
| 4 | Peroxide/sulfuric acid neutralizer | 40 | Clean |
| 5 | Peroxide/sulfuric acid neutralizer | 20 | carbon residue remained |
| 6 | Peroxide/sulfuric acid neutralizer | 10 | carbon residue remained |
| 7 | Neutralizer/Sacrificial Coating Solution | 40 | Clean |
| 8 | Neutralizer/Sacrificial Coating Solution | 20 | Clean |
| 9 | Neutralizer/Sacrificial Coating Solution | 10 | Clean |

When permanganate was neutralized with conventional hydroxylamine and peroxide/sulfuric acid based neutralizer (Run 1 to 6), it was necessary to remove 40 microinches of copper with microetch to acquire clean surface. When sacrificial coating was applied in the neutralization step (Run 7 to 9), clean copper surface was acquired with 10 microinch copper removal with microetch. Example 1 demonstrates that application of sacrificial layer improves carbon removal in the direct metallization process. Copper removal by microetch can be decreased by 50% or more while maintaining a clean surface.

EXAMPLE 2

Three multilayer printed circuit boards with through holes are processed according to the sequences in the Example 1 followed by copper electroplating with HiSpec® solution for an hour. Table 2 describes the neutralization step used for each panel.

TABLE 2

Multilayer test with and without sacrificial coating

| Run | Neutralization |
|---|---|
| 1 | Hydroxylamine Sulfate |
| 2 | Peroxide Sulfuric Neutralizer |
| 3 | Neutralizer/Sacrificial Coating Solution |

After processing, the boards, and the holes and interconnections therein, are examined visually, by standard cross section and microscopic analysis, and by standard solder shock testing by immersion in molten solder at 550 degree F. for 10 seconds. Cross-sectioning and microscopic analysis shows that the hole plated with a smooth uniformly thick layer of copper in all three panels. Microscopic analysis of inner layers also revealed that the number of innerlayer contamination defects in cross sectioned samples and solder shock-cross sectioned samples decreased by at least 30% in panels of Run 3 comparing with Runs 1 and 2. Example 2 demonstrates that application of sacrificial layer produces cleaner copper innerlayer surfaces in the holes of printed circuit boards after the direct metallization process.

EXAMPLE 3

Double-sided printed circuit boards with through holes are processed according to the sequences in the example 1. All boards were laminated, exposed and developed followed by Cu—Sn plating. All panels were carefully inspected to observe any blisters, halos or dry film lifting caused by poor dry film adhesion. Four kinds of dry films, AQUA MER® DI 200, AQUA MER® DI 300, AQUA MER® MP 420 and AQUA MER® PR 100 were used for the test. The dry film adhesion evaluation is described in table 3.

TABLE 3

Dry film adhesion test with and without sacrificial coating

| Run | Neutralization | AQUA MER® DI 200 Dry film | AQUA MER® DI 300 Dry film | AQUA MER® MP 400 Dry film | AQUA MER® PR 100 Dry film |
|---|---|---|---|---|---|
| 1 | Hydroxylamine Sulfate | good | good | severe halo due to dry film lifting | good |
| 2 | Peroxide/ sulfuric acid neutralizer | good | good | severe halo due to dry film lifting | good |
| 3 | Neutralizer/ Sacrificial Coating Solution | good | good | good | good |

As described in table 3, a sample processed with conventional hydroxylamine sulfate and peroxide/sulfuric neutralizers in Runs 1 and 2 showed good adhesion with three of the dry films, but showed poor adhesion with AQUA MER® MP 400 dry film. The new process (Run 3) improved dry film adhesion property of processed panels, showing good adhesion with all dry films. Example 3 demonstrates that this new process resulted in a surface more conducive to dry film adhesion.

Note: As used in all examples, the Neutralizer/Sacriticial Coating Solution consisted of:
  36 g/l hydrogen peroxide
  90 g/l sulfuric acid (98% by weight)
  6.5 g/l benzotriazole

What is claimed is:

1. A process for plating objects comprised of metallic areas and non-conductive areas, said process comprising the steps of:
   a. contacting the objects comprised of metallic areas and non-conductive areas to be plated with, in order:
      1) alkaline desmear solution comprising permanganate ions;
      2) a neutralizer/sacrificial coating solution comprising (i) acid, (ii) hydrogen peroxide, and (iii) corrosion inhibitor selected from the group consisting of alkyl imidazoles, alkyltriazoles, aromatic imidazoles, aromatic triazoles and combinations of the foregoing compounds, wherein the neutralizer/sacrificial coating solution neutralizes the non-conductive areas to be plated and applies a sacrificial coating to the metallic areas;
      3) conditioner solution comprising a material selected from the group consisting of surfactants and water soluble polymers;
      4) aqueous dispersion of carbon particles consisting essentially of (i) a surfactant or a water soluble polymer, (ii) carbon particles, and (iii) a liquid dispersing medium;
   b. drying the objects comprised of metallic areas and non-conductive areas;
   c. contacting the objects comprised of metallic areas and non-conductive areas with a microetchant solution; and thereafter
   d. contacting the objects comprised of metallic areas and non-conductive areas with a copper electroplating solution with an electrical potential applied.

2. A process according to claim 1, wherein the objects comprised of metallic areas and non-conductive areas are printed circuit boards.

3. A process according to claim 1, wherein the metallic areas comprise copper and wherein the non-conductive areas comprise a resinous or polymeric material.

4. A process according to claim 1, wherein the neutralizer/sacrificial coating solution further comprises a surfactant.

5. A process according to claim 4, wherein the conditioner solution has an alkaline pH.

6. A process according to claim 1, wherein the surfactant or water soluble polymer in the aqueous dispersion of carbon particles is a surfactant.

* * * * *